United States Patent
Wang et al.

(10) Patent No.: US 6,750,533 B2
(45) Date of Patent: Jun. 15, 2004

(54) SUBSTRATE WITH DAM BAR STRUCTURE FOR SMOOTH FLOW OF ENCAPSULATING RESIN

(75) Inventors: Yu-Po Wang, Miaoli (TW); Chung-Chi Lin, Miaoli (TW); Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/175,217

(22) Filed: Jun. 19, 2002

(65) Prior Publication Data

US 2003/0193082 A1 Oct. 16, 2003

(30) Foreign Application Priority Data

Apr. 10, 2002 (TW) .......................... 91107151 A

(51) Int. Cl.⁷ ............................................. H01L 23/495
(52) U.S. Cl. ..................... 257/667; 257/669; 257/674
(58) Field of Search ................... 257/667, 669, 257/674, 773

(56) References Cited

U.S. PATENT DOCUMENTS

| | | | |
|---|---|---|---|
| 5,331,205 A | | 7/1994 | Primeaux .................... 257/790 |
| 5,436,203 A | * | 7/1995 | Lin ............................. 437/209 |
| 5,736,792 A | | 4/1998 | Orcutt ......................... 257/783 |
| 5,953,589 A | * | 9/1999 | Shim et al. ................. 438/106 |
| 5,989,474 A | * | 11/1999 | Suzuki ........................ 264/400 |
| 6,031,281 A | | 2/2000 | Kang et al. ................. 257/692 |
| 6,043,108 A | * | 3/2000 | Izumi et al. ................ 438/111 |
| 6,048,656 A | * | 4/2000 | Akram et al. .............. 430/118 |
| 6,104,085 A | * | 8/2000 | Muto et al. ................. 257/675 |
| 6,211,574 B1 | | 4/2001 | Tao et al. .................... 257/784 |
| 6,225,685 B1 | * | 5/2001 | Newman et al. ........... 257/666 |
| 6,268,654 B1 | * | 7/2001 | Glenn et al. ............... 257/704 |
| 6,303,978 B1 | * | 10/2001 | Daniels et al. ............. 257/642 |
| 6,369,440 B1 | * | 4/2002 | Kobayashi .................. 257/672 |
| 6,451,628 B1 | * | 9/2002 | Tani et al. .................. 438/112 |
| 6,469,369 B1 | * | 10/2002 | Lee ............................. 257/670 |
| 6,512,287 B1 | * | 1/2003 | Oka ............................. 257/678 |
| 2002/0031867 A1 | * | 3/2002 | Horiuchi et al. ........... 438/125 |

FOREIGN PATENT DOCUMENTS

JP          404132258     *  5/1992  ................. 257/777

* cited by examiner

Primary Examiner—Amir Zarabian
Assistant Examiner—Monica Lewis
(74) Attorney, Agent, or Firm—Peter F. Corless; Steven M. Jensen; Edwards & Angell, LLP

(57) ABSTRACT

A chip carrier with a dam bar structure is proposed. The chip carrier is defined with at least a chip attach area and a wire bonding area surrounding the chip attach area, allowing a chip to be mounted on the chip attach area and electrically connected to the wire bonding area by bonding wires bonded to the wire bonding area. A molding gate and a dam bar are formed on the substrate outside the chip attach area and wire bonding area. An molding compound is injected through the molding gate for encapsulating the chip and bonding wires. The dam bar is provided with a first gate directed toward the molding gate, a second gate and a third gate opposed to the second gate, wherein the second and third gates are each vertically arranged with respect to the molding gate, allowing the molding compound to divert its flow direction by the dam bar.

15 Claims, 5 Drawing Sheets

SUBSTRATE WITH DAM BAR STRUCTURE FOR SMOOTH FLOW OF ENCAPSULATING RESIN

FIELD OF THE INVENTION

The present invention relates to chip carriers, and more particularly, to a substrate for use in a BGA (ball grid array) semiconductor package.

BACKGROUND OF THE INVENTION

A ball grid array (BGA) package is an advanced semiconductor technology characterized by using high-density arrangement of solder balls as input/output (I/O) connections, allowing a chip mounted on a substrate to be electrically connected to an external device by means of the solder balls.

In concern of protecting the chip and bonding wires for electrically connecting the chip to the substrate from external impact and contaminant, a molding process is performed, and the substrate mounted with the chip and bonding wires is placed in a mold cavity, allowing a molding compound to be injected into the mold cavity for encapsulating the chip and bonding wires. As shown in FIG. 5A, when a molding compound (as indicated by arrows in the drawing) is injected to a substrate 1 through a gate 10, bonding wires 11 would be subject to mold flow impact from the molding compound, thereby undesirably causing wire sweep of the bonding wires 11, especially for those (as circled in the drawing) vertically arranged in position with respect to a flow direction of the molding compound. By virtue of wire sweep, adjacent bonding wires would possibly come into contact with each other, which causes short circuit of bonding wires and adversely affects the yield of package products.

Moreover, as shown in FIG. 5B, for the substrate 1 being used in a MCM (multiple chip module) package with a plurality of chips 12 and bonding wires 11 bonded to respective chips 12 being mounted on the substrate 1, mold flow of the molding compound would be affected by uneven distribution of the chips 12 and bonding wires 11 on the substrate 1. For example, mold flow would have a higher flowing speed at a region RI free of chips 12 and bonding wires 11 than at a region R2 mounted with chips 12 and bonding wires 11 on the substrate 1. Bonding wires 11 (as circled in the drawing) vertically arranged with respect to a flow direction of the molding compound would be directly subject to mold flow impact, thereby causing a greatest extent of wire sweep. Further, uneven flowing speeds of mold flow may also lead to turbulence, making an encapsulant fabricated by the molding compound undesirably formed with voids, which would generate popcorn effect during subsequent high-temperature processes, and thus adversely affect the quality and yield of products.

Accordingly, a plurality of solutions to wire sweep problems are disclosed in the related patents, for example, are U.S. Pat. Nos. 6,031,281, 5,331,205, 6,211,574 and 5,736,792.

As shown in FIG. 6, U.S. Pat. No. 6,031,281 teaches forming of a dummy wire 21 at a corner wire-bonding area of a chip 20. The dummy wire 21 and a functional wire 22 are both bonded to a same single lead 23, and equally dimensioned in loop height. When the functional wire 22 is subject to mold flow impact and swept, it comes into contact with the dummy wire 21 without causing short circuit, such that other bonding wires 24 can be protected from being touched by the swept wire 22, and suffer less impact from mold flow of a molding compound. However, forming of the dummy wire 21 would be only effective to certain or restricted-arranged bonding wires e.g. functional wire 22. For fine-pitch or high-density arrangement of leads or bonding wires, dummy wires would be hardly fabricated to protect functional bonding wires.

U.S. Pat. No. 5,331,205 discloses the use of twice encapsulating processes. As shown in FIG. 7, a chip 30 and bonding wires 31 are first encapsulated by a resin material 32 such as epoxy resin-and then-a molding process is performed to form an encapsulant 33 for packaging entire semiconductor structure. However, this method is relatively complex to implement; delamination would easily occur at interface between the resin material 32 and the encapsulant 33, making quality of fabricated products undesirably deteriorated.

As shown in FIG. 8, U.S. Pat. No. 6,211,574 uses a resin material e.g. epoxy resin to form a support member 42 at middle part of bonding wires 41, so as to hold the bonding wires 41 in position without being swept by mold flow impact during a molding process. However, when the resin material is applied to the bonding wires 41 for forming the support member 42, it may easily deform the bonding wires 41 or adversely affect electrical connection quality of the bonding wires 41, thereby reducing the yield of package products.

U.S. Pat. No. 5,736,792 is characterized by applying an epoxy adhesive to bonding wires, for the purpose of firmly positioning the bonding wires without being swept or dislocated; this method leads to the same drawbacks of damaging or affecting electrical connection quality of bonding wires, as described for the above U.S. Pat. No. 6,211,574.

In response to the above drawbacks, how to develop a substrate for use in a semiconductor package so as to prevent wire sweep and short circuit between adjacent bonding wires, is therefore a critical problem to solve.

SUMMARY OF THE INVENTION

A primary objective of the present invention is to provide a substrate with a dam bar structure, allowing mold flow of a molding compound to be impeded by a dam bar and divert its flow direction, so as to effectively reduce the occurrence of wire sweep and short circuit between adjacent bonding wires, thereby preventing voids in an encapsulant and popcorn effect from occurrence.

In accordance with the above and other objectives, the present invention proposes a substrate with a dam bar structure, the substrate being defined on a surface thereof with at least a chip attach area and a wire bonding area surrounding the chip attach area, allowing a chip to be mounted on the chip attach area and electrically connected to the substrate by a plurality of bonding wires bonded to the wire bonding area. A molding gate and a dam bar are formed on the surface of the substrate outside the chip attach area and the wire bonding area, a molding compound is adapted to be injected through the molding gate for encapsulating the chip and the bonding wires, and the dam bar is provided with at least a first gate directed toward the molding gate, a second gate and a third gate opposed to the second gate, wherein the second and third gates are vertically arranged in position with respect to the molding gate, so as to allow the molding compound to be diverted with a flow direction thereof by the dam bar.

By forming of the dam bar on the substrate, the molding compound is adapted to be impeded by the dam bar and diverted to flow through the second and third gates of the dam bar into the chip attach area and the wire bonding area. Moreover, diverted molding compound through the second and third gates flows in a direction substantially parallel to bonding wires arranged nearby the second and third gates; this effectively reduce impact from mold flow of the molding compound to the bonding wires, such that the bonding wires vertically arranged with respect to the molding gate can be effectively prevented from being swept by mold flow impact.

Moreover, after being impeded by the dam bar and divert to flow into the second and third gates, the encapsulating compound would accordingly decrease its flowing speed, which further helps reduce its mold flow impact to the bonding wires, making the bonding wires less likely subject to wire sweep or short circuit. Furthermore, the molding compound would simultaneously flow through the second and third gates to evenly encapsulate the chip and the bonding wires disposed on the chip attach area and the wire bonding area on the substrate respectively.

In another embodiment of the invention, the substrate with a dam bar structure is defined on a surface thereof with a plurality of chip attach areas and wire bonding areas surrounding the chip attach areas respectively, allowing a plurality of chips to be mounted on the chip attach areas and electrically connected to the substrate by a plurality of bonding wires bonded to the wire bonding areas respectively. At least a dam bar is formed on the surface of the substrate outside the chip attach areas and the wire bonding areas in a manner that, an encapsulating compound is adapted to smoothly and evenly flow into the chip attach areas and the wire bonding areas for encapsulating the chips and the bonding wires.

The dam bar is used to balance distribution of the chip attach areas and the wire bonding areas on the substrate, thereby making the encapsulating compound more smoothly and evenly flow to encapsulate the chips and bonding wires disposed on the chip attach areas and wire bonding areas. Therefore, it is greatly beneficial of using the substrate of the invention, which can effectively reduce the occurrence of wire sweep and prevent voids from being formed in the cured molding compound or encapsulant, thereby assuring quality and yield of package products; unlike in the prior art of using a conventional MCM substrate with uneven arrangement of chips and bonding wires, which would cause uneven flowing speeds or turbulence of a molding compound, and possibly lead to voids formed in the encapsulant and popcorn effect that seriously damage the package structure.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

The following description is made with reference to FIGS. 1 to 4 for detailing preferred embodiments of a substrate with a dam bar structure proposed in the present invention. The drawings are made in a simplified manner as to only illustrate components or parts related to the disclosure of this invention; it should be understood that, these components or parts are not drawn in real sizes or numbers, and the substrate of this invention is structurally more complex in practical fabrication. A substrate for use in a BGA (ball grid array) semiconductor package is exemplified hereinafter without setting any restriction to the scope of the invention.

First Preferred Embodiment

Figure 1:
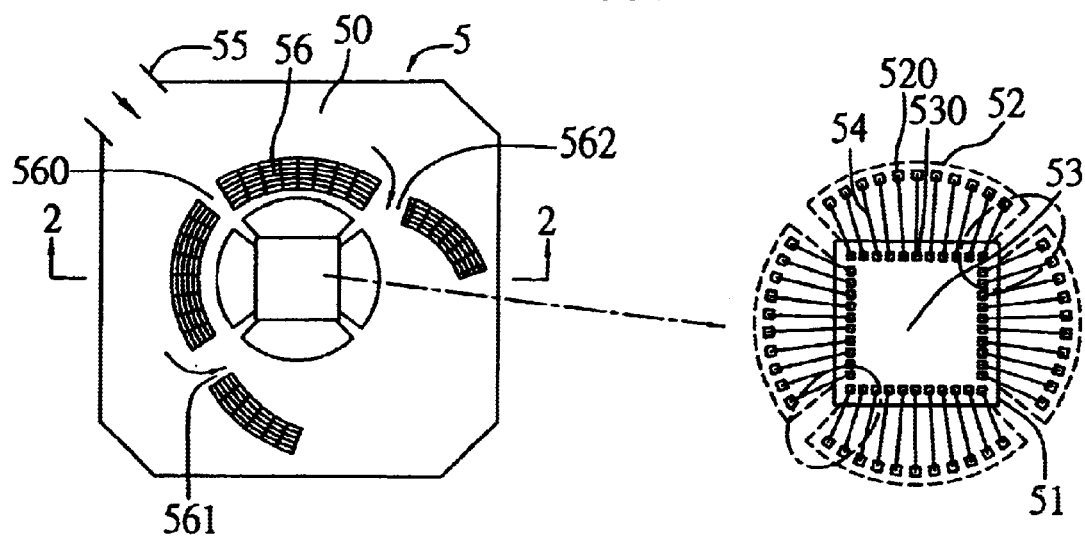
FIG. 1 is a top view of a first embodiment of a substrate of the invention.
Figure 2:
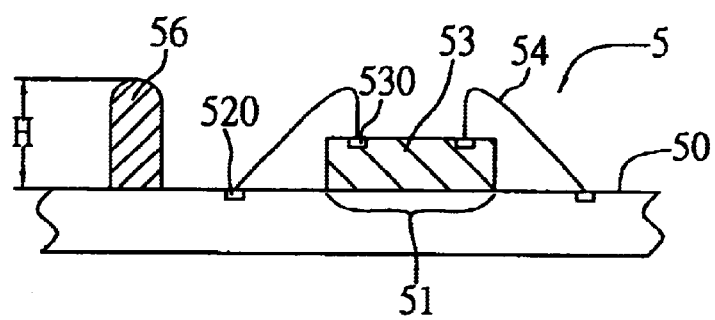
FIG. 2 is a cross-sectional view of the substrate of FIG. 1 cutting along a line 2—2.

FIG. 1 and FIG. 2 illustrate a substrate with a dam bar structure of the invention. As shown in the drawings, a substrate 5 suitably used for a BGA semiconductor package is prepared. The substrate 5 is mainly made of a conventional resin material such as epoxy resin, polyimide resin, BT resin or FR4 resin.

The substrate 5 is defined on a surface 50 thereof with at least a chip attach area 51 and a wire bonding area 52 surrounding the chip attach area 51. The chip attach area 51 is used for mounting a chip 53 thereon, and a plurality of bonding wires 54 e.g. gold wires are bonded to bond pads 530 formed on the chip 53 and to bond fingers 520 formed on the wire bonding area 52, so as to electrically connect the chip 53 to the substrate 5.

The surface 50 of the substrate 5 is further formed with a dam bar 56 outside the chip attach area 51 and the wire bonding area 52. In a molding process, a molding compound such as epoxy resin (as indicated by arrows in the drawing) is injected through the molding gate 55 to the substrate 5, and adapted to flow and spread over the chip attach area 51 and the wire bonding area 52, so as to form an encapsulant (not shown) that encapsulates the chip 53 and the bonding wires 54.

The dam bar 56 is made of an insulating material, and can be fabricated simultaneously with the substrate 5 or prior to the molding process. The former case allows the dam bar 56 to be fabricated in a batch manner on the substrate 5 by a printing process; in the latter case, the dam bar 56 is formed on the substrate 5 by currently available equipment without increasing fabrication costs.

The dam bar 56 is approximately a U-shape, and located peripherally outside the chip attach area 51 and the wire bonding area 52. The dam bar 56 is formed with a predetermined number of gates for controlling a flow direction of the encapsulating compound in a manner as to effectively reduce mold flow impact and wire sweep for the bonding wires 54, thereby preventing short circuit between adjacent bonding wires 54. The geometry shape and height of the dam bar 56 are critical factors for affecting mold flow of the encapsulating compound (as detailed hereinafter), wherein a printing-made dam bar 56 has preferable stability in height.

Geometry Shape of Dam Bar

The dam bar 56 formed on the substrate 5, as shown in FIG. 1, is preferably provided with a first gate 560 directed toward the molding gate 55, a second gate 561, and a third gate 562 opposed to the second gate 561, wherein the second and third gates 561, 562 are vertically arranged in position with respect to the molding gate 55; this allows the dam bar 56 to be divided into four sections by means of the first, second and third gates 560, 561, 562.

The first gate 560 is sized smaller than the second and third gates 561, 562 respectively. The first gate 560 needs to be considerably small for reducing a flowing speed of the molding compound without causing voids formed in the cured molding compound or encapsulant. The second and third gates 561, 562 are respectively dimensioned sufficiently to allow the molding compound to smoothly flow into the chip attach area 51 and the wire bonding area 52, such that the chip 53 and bonding wires 54 can be encapsulated by the molding compound.

By forming of the dam bar 56, mold flow of the molding compound would mostly change its flow direction in a manner that, the molding compound injected from the molding gate 55 is impeded by the dam bar 56, and diverts to flow through the second and third gates 561, 562 into the chip attach area 51 and the wire bonding area 52 (as indicated by arrows in the drawing). Moreover, the diverted molding compound through the second and third gates 561, 562 is directed toward a direction substantially parallel to arrangement of bonding wires 54 (as circled in the drawing); this thereby greatly reduce mold flow impact to the bonding wires 54 that are vertically arranged with respect to the molding gate 55, thereby effectively preventing wire sweep from occurrence. Therefore, the invention can significantly resolve drawbacks in the prior art of causing severe wire sweep by mold flow impact without forming of a dam bar on a substrate.

Moreover, after being impeded by the dam bar 56 and diverted to flow into the second and third gates 561, 562, the molding compound would also decrease its flowing speed, which further reduces mold flow impact and wire sweep for the bonding wires 54 as well as prevent short circuit between adjacent bonding wires 54. Furthermore, the molding compound flows simultaneously from the second and third gates 561, 562 into the chip attach area 51 and the wire bonding area 52, making mold flow smoothly spread to evenly encapsulate the chip 53 and bonding wires 54.

COMPARATIVE EXAMPLES

Figure 3A:
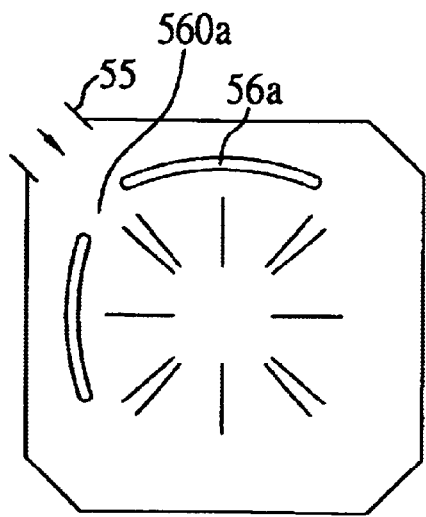
FIGS. 3A–3C are top views of comparative examples for a dam bar of the substrate of the invention.
Figure 3B:
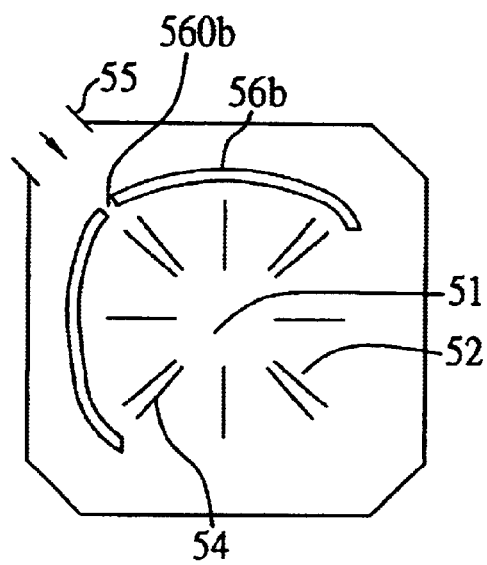
Figure 3C:
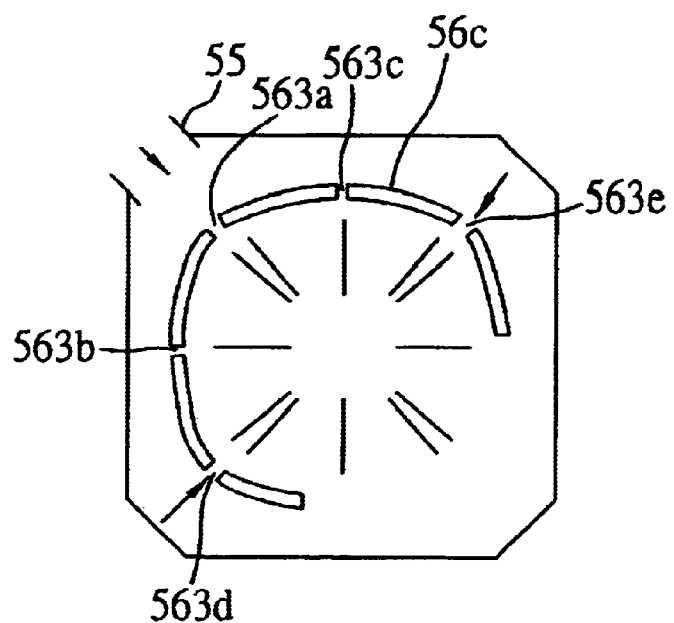

FIGS. 3A–3C illustrate comparative examples for the dam bar of the invention; the dam bar 56 of FIG. 1 is of a preferable geometry shape that eliminates drawbacks of the comparative examples (as detailed hereinafter).

As shown in FIG. 3A, a simple dam bar 56a is formed with a gate 560a directed toward the molding gate 55, and has found to be ineffective for impeding mold flow of the molding compound.

A dam bar 56b of FIG. 3B is similar in structure to the dam bar 56a of FIG. 3A, with the difference in that the dam bar 56b is dimensioned with increased length, and a gate 560b of the dam bar 56b is sized smaller than the gate 560a of the dam bar 56a. It has been found that, such a dam bar 56b would reduce a flowing speed of the molding compound that flows into the chip attach area 51 and the wire bonding area 52, thereby help protect the bonding wires 54 from being swept by mold flow impact.

A dam bar 56c of FIG. 3C is an improved structure of the dam bar 56b of FIG. 3B. The dam bar 56c is provided with a plurality of gates 563a–e (five gates in total), for the purpose of diverting mold flow of the molding compound (as indicated by arrows in the drawing). However, it has been found that, such a dam bar 56c with five gates 563a–e is not effective for changing a flow direction of the molding compound.

Therefore, by further improving the dam bar 56c of FIG. 3C in a manner that, gates 563b, 563c are sealed and gates 563d, 563e are enlarged in dimension, a structure of the dam bar 56 is thus preferably fabricated as shown in FIG. 1. With provision of the dam bar 56, mold flow of the molding compound would be mostly diverted to flow through the second and third gates 561, 562 into the chip attach area 51 and the wire bonding area 52 on the substrate 5, so as to effectively reduce the occurrence of wire sweep for the bonding wires 54 without causing short circuit between adjacent bonding wires 54, thereby assuring yield of fabricated package products.

Height of Dam Bar

As shown in FIG. 2 the dam bar 56 formed on the substrate 5 is preferably dimensioned with a height H larger than three-fourth height of a mold cavity (not shown). For example, if the mold cavity is 1 mm high, height H of the dam bar 56 is from 0.75 to 1 mm, preferably 1 mm; such a dam bar 56 is capable of providing sufficient impedance to mold flow of the molding compound and effectively preventing wire sweep of the bonding wires 54. With decrease in height H of the dam bar 56, prevention of wire sweep for the bonding wires 54 is accordingly reduced. For example, if height H of the dam bar 56 is reduced to 0.75 mm, mold flow of the molding compound cannot be effectively impeded by the dam bar 56; if the dam bar 56 is further reduced to 0.5 mm, the dam bar 56 will malfunction on affecting mold flow of the molding compound, as in the case without forming a dam bar on a conventional substrate.

Second Preferred Embodiment

Figure 4:
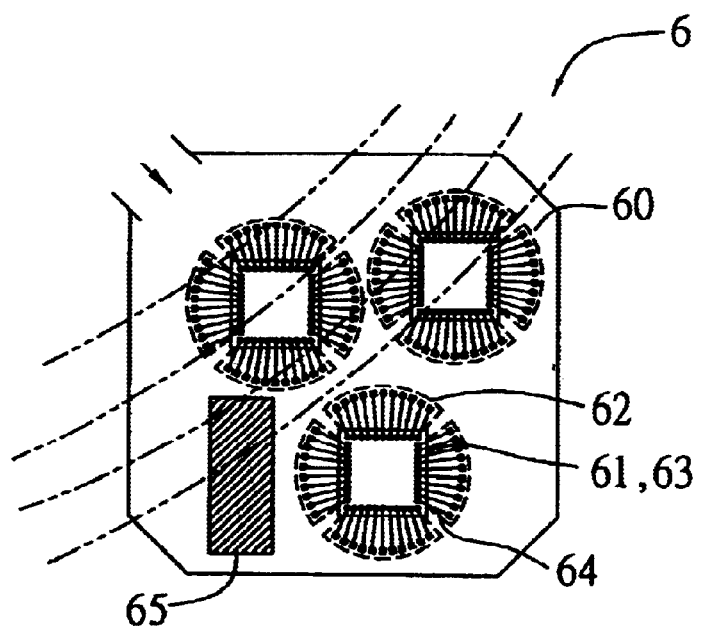
FIG. 4 is a top view of a second embodiment of a substrate of the invention.
Figure 5A:
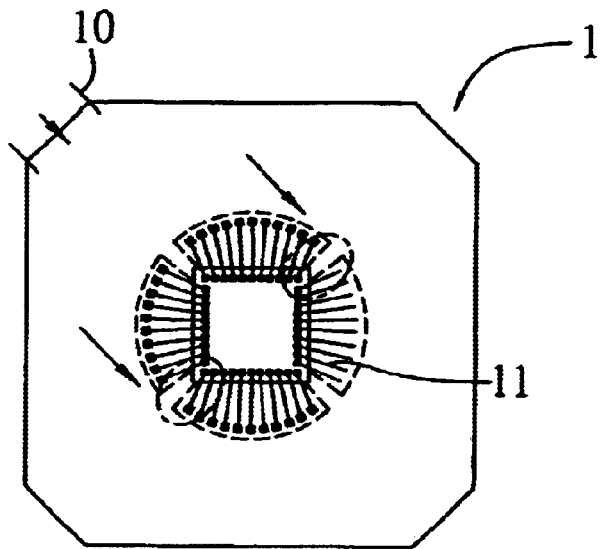
FIGS. 5A and 5B (PRIOR ART) are top views of a conventional substrate.
Figure 5B:
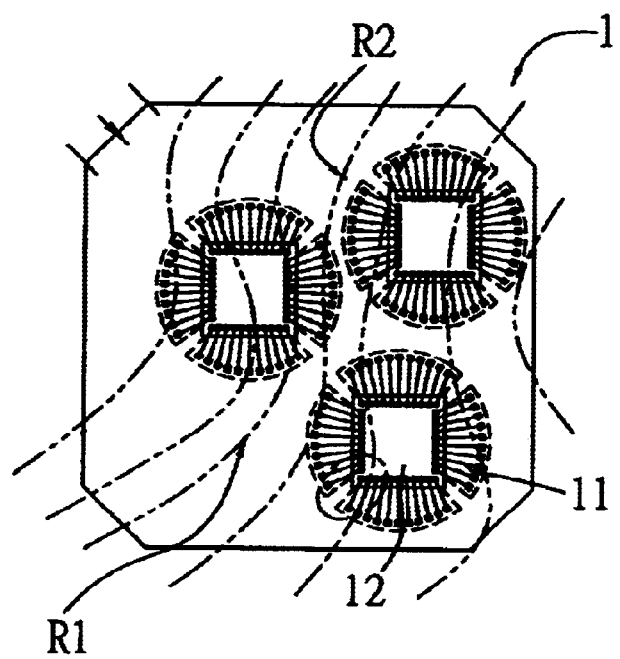
Figure 6:
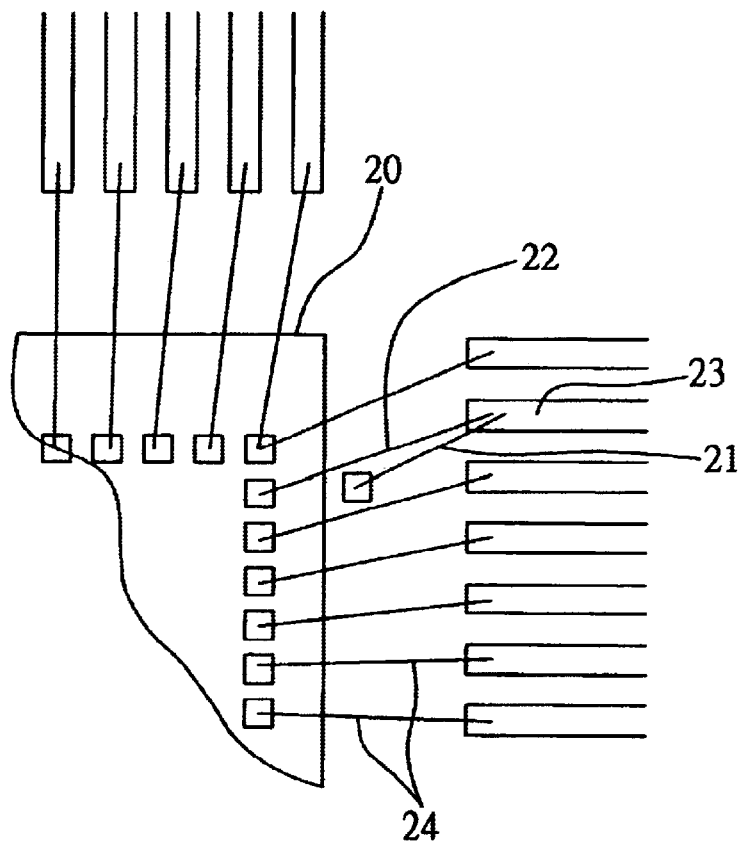
FIG. 6 (PRIOR ART) is a top view showing arrangement of chips and bonding wires disclosed in U.S. Pat. No. 6,031,281.
Figure 7:
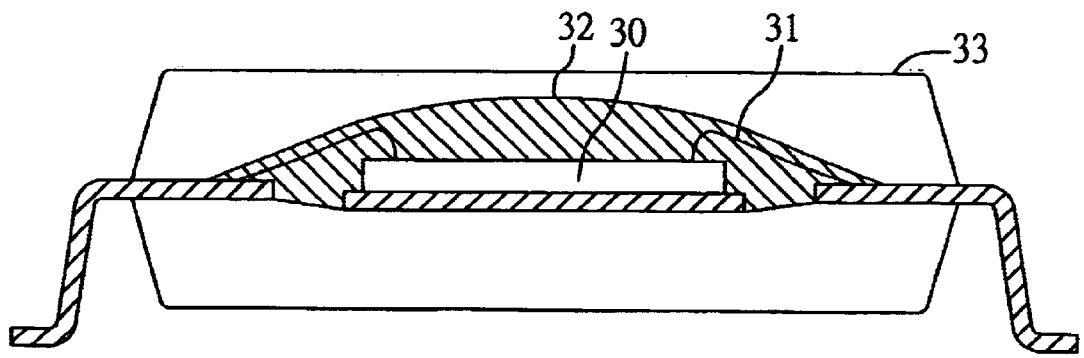
FIG. 7 (PRIOR ART) is a cross-sectional view of a package structure disclosed in U.S. Pat. No. 5,331,205.
Figure 8:
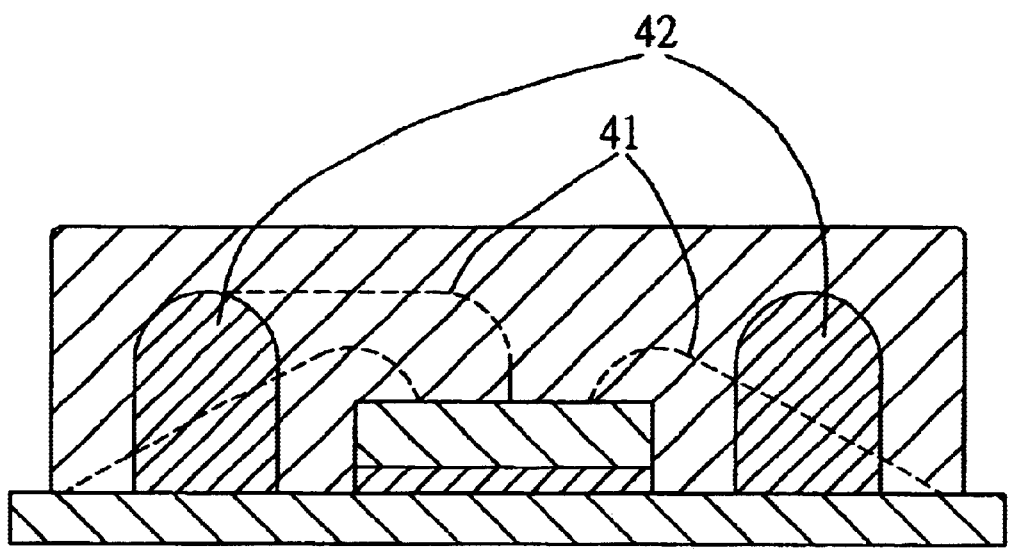
FIG. 8 (PRIOR ART) is a cross-sectional view of a package structure disclosed in U.S. Pat. No. 6,211,574.

FIG. 4 illustrates a second embodiment of a substrate 6 with a dam bar structure of the invention. As shown in the drawing, the substrate 6 is used in a MCM (multiple chip module) semiconductor package. A surface 60 of the substrate 6 is defined with a plurality of chip attach areas 61 and wire bonding areas 62 respectively surrounding the chip attach areas 61, allowing a plurality of chips 63 mounted on the chip attach areas 61 to be electrically connected to the substrate 6 by bonding wires 64 bonded to the wire bonding areas 62.

Besides the chip attach areas 61 and wire bonding areas 62, the surface 60 of the substrate 6 is further formed with at least a dam bar 65, which is shaped or structured without being restricted to illustration in the drawing. The dam bar 65 is used to balance distribution of the chip attach areas 61 and the wire bonding areas 62 on the substrate 6, thereby making mold flow of a molding compound to flow more smoothly and evenly flow to encapsulate the chips 63 and bonding wires 64 disposed on the chip attach areas 61 and wire bonding areas 62. Therefore, it is greatly beneficial of using the substrate 6 of the invention, which can effectively reduce the occurrence of wire sweep and prevent voids from being formed in the cured molding compound or encapsulant, thereby assuring quality and yield of fabricated products; unlike in the prior art of using a conventional MCM substrate with uneven arrangement of chips and bonding wires, which would cause uneven flowing speeds or turbulence of the molding compound, and possibly lead to voids formed in the encapsulant and popcorn effect that seriously damage the package structure.

The invention has been described using exemplary preferred embodiments. However, it is to be understood that the scope of the invention is not limited to the disclosed embodi-

What is claimed is:

1. A substrate with a dam bar structure, comprising:
   at least a chip attach area and a conductive-element bonding area formed on a surface of the substrate, with the conductive-element bonding area surrounding the chip attach area, so as to allow a chip to be mounted on the chip attach area and electrically connected to the substrate by a plurality of conductive elements bonded to the conductive-element bonding area;
   a molding gate formed on the surface of the substrate outside the chip attach area and the conductive-element bonding area, allowing an encapsulating compound to be injected through the molding gate for encapsulating the chip and the conductive elements; and
   a dam bar formed on the surface of the substrate outside the chip attach area and the conductive-element bonding area, wherein the dam bar is provided with at least a first gate directed toward the molding gate, a second gate and a third gate opposed to the second gate, and the second and third gates are each vertically arranged in position with respect to the molding gate, so as to allow the encapsulating compound to divert with a flow direction thereof by the dam bar, wherein the first gate is sized smaller than the second and third gates respectively.

2. The substrate of claim 1, wherein the substrate is made of a resin material selected from a group consisting of epoxy resin, polyimide resin, BT resin, and FR4 resin.

3. The substrate of claim 1, wherein the conductive elements are bonding wires.

4. The substrate of claim 1, wherein the encapsulating compound is a resin compound.

5. The substrate of claim 1, wherein the dam bar is made of an insulating material.

6. The substrate of claim 1, wherein the dam bar is formed on the substrate by a printing process.

7. The substrate of claim 1, wherein the dam bar is approximately U-shaped, and divided into four sections by means of the first, second and third gates.

8. The substrate of claim 1, wherein the dam bar is dimensioned in height greater than three-fourth height of a mold cavity used for filling with the encapsulating compound.

9. The substrate of claim 1, wherein the first gate is sized in a manner as to reduce a flowing speed of the encapsulating compound without forming voids in the encapsulating compound.

10. The substrate of claim 1, wherein the second and third gates are each sized for allowing the encapsulating compound to flow into the chip attach area and the conductive-element bonding area.

11. A substrate with a dam bar structure, comprising:
    a plurality of chip attach areas and conductive-element bonding areas formed on a surface of the substrate, with each of the conductive-element bonding areas surrounding a corresponding one of the chip attach areas, so as to allow a plurality of chips to be respectively mounted on the chip attach areas and electrically connected to the substrate by a plurality of conductive elements bonded to the conductive-element bonding areas; and
    at least a dam bar formed on the surface of the substrate outside the chip attach areas and the conductive-element bonding areas, allowing an encapsulating compound to smoothly and evenly flow into the chip attach areas and the conductive-element bonding areas for encapsulating the chips and the conductive elements, wherein the dam bar is adapted to balance distribution of the chip attach areas and the conductive-element bonding areas on the substrate.

12. The substrate of claim 11, wherein the conductive elements are bonding wires.

13. The substrate of claim 11, wherein the dam bar is made of an insulating material.

14. The substrate of claim 11, wherein the dam bar is formed on the substrate by a printing process.

15. The substrate of claim 11, wherein the encapsulating compound is a resin compound.

* * * * *